United States Patent
Razavi et al.

(10) Patent No.: US 6,509,777 B2
(45) Date of Patent: Jan. 21, 2003

(54) METHOD AND APPARATUS FOR REDUCING DC OFFSET

(75) Inventors: Behzad Razavi, Los Angeles, CA (US); Pengfei Zhang, Fremont, CA (US)

(73) Assignee: Resonext Communications, Inc., San Jose, CA (US)

( * ) Notice: Subject to any disclaimer, the term of this patent is extended or adjusted under 35 U.S.C. 154(b) by 41 days.

(21) Appl. No.: 09/768,841

(22) Filed: Jan. 23, 2001

(65) Prior Publication Data

US 2002/0097081 A1 Jul. 25, 2002

(51) Int. Cl.⁷ .................................................. H03L 5/00
(52) U.S. Cl. ........................................ 327/307; 327/316
(58) Field of Search .................................. 327/307, 316; 455/343, 3.02, 24; 375/316, 319

(56) References Cited

U.S. PATENT DOCUMENTS

| | | | |
|---|---|---|---|
| 4,612,585 A | 9/1986 | Takase et al. ................ 358/316 |
| 4,766,497 A | 8/1988 | Banach et al. ............... 358/188 |
| 5,471,665 A | * 11/1995 | Pace et al. ................... 455/343 |
| 5,635,892 A | 6/1997 | Ashby et al. ................ 336/200 |
| 5,736,749 A | 4/1998 | Xie ................................ 257/3 |
| 5,745,838 A | 4/1998 | Tresness et al. .............. 455/5.1 |
| 6,008,102 A | 12/1999 | Alford et al. ................ 438/381 |
| 6,031,432 A | 2/2000 | Schreuders ............... 333/24 R |
| 6,356,736 B2 | * 3/2002 | Tomasz et al. ............. 455/3.02 |

OTHER PUBLICATIONS

Lam, C. and Razavi, B., "A 2.6–GHz/5.2–GHz Frequency Synthesizer in 0.4–μm CMOS Technology", *IEEE Journal of Solid–State Circuits*, vol. 35, No. 5, May 2000, pp. 788–794.

Rategh et al., "A CMOS Frequency Synthesizer with an Injection–Locked Frequency Divider for a 5–GHz Wireless LAN Receiver", *IEEE Journal of Solid–State Circuits*, vol. 35, No. 5, May 2000, pp. 780–787.

Samavati et al., "A 5–GHz CMOS Wireless LAN Receiver Front End", *IEEE Journal of Solid–State Circuits*, vol. 35, No. 5, May 2000, pp. 765–772.

Wong et al., "A Wide Turning Range Gated Varactor", *IEEE Journal of Solid–State Circuits*, vol. 35, No. 5, May 2000, pp. 773–779.

Liu T. and Westerwick, E., "5–GHz CMOS Radio Transceiver Front–End Chipset", *IEEE Journal of Solid–State Circuits*, vol. 35, No. 12, Dec. 2000, pp. 1927–1941.

Steyaert et al., "A 2–V CMOS Cellular Transreceiver Front–End", *IEEE Journal of Solid–State Circuits*, vol. 35, No. 12, Dec. 2000, pp. 1895–1907.

\* cited by examiner

Primary Examiner—Tuan T. Lam
Assistant Examiner—Hiep Nguyen
(74) Attorney, Agent, or Firm—Babak S. Sani; Townsend and Townsend and Crew LLP

(57) ABSTRACT

Various circuits and methods provide for dc offset reduction that is effective under varying circuit and signal conditions. The offset signal is first sampled and stored, and then subtracted from the signal path via a programmable transconductance amplifier that is placed in a feedback loop during offset reduction. By designing the transconductance amplifier to have programmable gain, the offset reduction technique is capable of compensating for variations in the magnitude of the offset signal. In one embodiment, an amplifier is placed in the feedback path in series with the programmable transconductance amplifier to optimize the trade off between noise and accuracy of offset reduction.

25 Claims, 4 Drawing Sheets

METHOD AND APPARATUS FOR REDUCING DC OFFSET

BACKGROUND OF THE INVENTION

The present invention relates in general to integrated circuits, and in particular to method and circuitry for removing undesirable dc offset in circuits of the type used in communication devices.

In electronic circuitry, noise, component mismatches and other types of imbalances often introduce a deviation in the intended value of a circuit reference signal. The amount of this deviation in the reference signal is commonly referred to as an offset signal. The impact of such an offset on the dc performance of a circuit is typically measured by referring its effects to the input of the circuit. During normal operation of a circuit, any offset signals (e.g., offset current or offset voltage) are indistinguishable from, and are processed similar to, the input signal. If, for example, the circuit amplifies the input signal, the offset signal is similarly amplified. This often leads to undesirable effects such as circuit saturation and potentially circuit malfunction.

Some circuits are more susceptible to the adverse effects of offset signals. For example, integrated circuits used in wireless communication devices are often required to perform signal processing in environments that are very sensitive to the introduction of noise and offset. In such applications, input signals to a receiver may be very small, on the order of, for example, 10 microvolts. FIG. 1 shows a simplified block diagram of a direct conversion receiver circuit 100 found in wireless communication devices. A radio frequency (RF) input signal is received by an antenna 102 and amplified by a low noise amplifier (LNA) 104. The signal is then applied to a mixer that multiplies the RF signal with a local oscillator signal (LO), and generates an intermediate frequency (IF) signal on line 108. The high frequency sum products of the IF signal is filtered by a low pass filter (LPF) 110, and the low frequency difference components are passed on to a gain block or baseband amplifier 114 to adjust the signal amplitude. An analog-to-digital (A/D) converter 116 digitizes the signal, and a digital signal processor (DSP) 118 processes the data.

Considering the circuit of FIG. 1, a serious dc offset problem arises due to feedback of the LO signal which is typically locally generated and is therefore a very strong signal. The feedback of the LO signal induces a signal on the RF input line 103 which is then amplified by LNA 104, and combined with the LO signal itself in mixer 106. This is commonly referred to as LO leakage. The result of this LO leakage is a dc voltage which appears as a significant dc offset at the output of mixer 106 on line 108. This dc offset passes through LPF 110 and may cause either the baseband amplifier 114 or A/D 116 (or both) to saturate.

Various offset cancellation techniques have been attempted in the past as discussed, for example, in chapter 13, section 13.2.1 of the book "Design of Analog CMOS Integrated Circuits," by B. Razavi. One approach deploys ac coupling filters to remove the dc component of the signal. For example, an RC high pass filter of the type shown in FIG. 2A may be inserted along the signal path at nodes 108 or 112 to filter out the dc offset signal. This approach, however, has a time constant problem. That is, to preserve input signal information at lower frequencies, the RC time constant of the ac coupling circuit has to be very large. This in turn renders the ac coupling circuit very slow and therefore inadequate to respond to sudden changes in the dc offset, resulting in possible loss of symbol and degradation in bit error rate (BER). A switched-capacitor ac coupler of the type shown in FIG. 2B that can sample changes in dc offset and respond accordingly has been used as an alternative. However, with this and other similar approaches the sampling of the offset can only occur at idle time when no signal is received by the receiver. Therefore, the switched-capacitor ac coupler cannot respond to dc offset changes that may occur while the receiver is processing its signal. This is particularly a problem for those receivers where LNA 104, for example, is designed to have programmable gain that may vary while receiving an input signal. There is therefore a need for an offset reduction technique that addresses problems caused by such circuit and signal conditions.

SUMMARY OF THE INVENTION

The present invention provides method and circuitry for dc offset reduction that is effective under varying circuit and signal conditions. Broadly, in one embodiment, the invention first samples and stores the offset signal Vos, and then subtracts Vos from the signal path via a programmable transconductance amplifiers that is placed in a feedback loop during offset reduction. By designing the transconductance amplifier to have programmable gain, the offset reduction technique of the present invention is capable of compensating for variations in the magnitude of the offset signal. In another embodiment, an amplifier is placed in the feedback path in series with the programmable transconductance amplifier to optimize the trade off between noise and accuracy of offset reduction.

Accordingly, in one embodiment, the present invention provides a circuit comprising a signal path having an input coupled to receive an input signal; a variable gain circuit coupled to receive the input signal and to generate an output signal at an output terminal; and an offset reduction circuit coupled to the output terminal, wherein, the offset reduction circuit includes a variable gain transconductance amplifier whose gain is adjusted in response to variations in the gain of the variable gain circuit.

In another embodiment, the present invention provides a receiver circuit comprising an input amplifier coupled to receive an input signal; a mixer having a first input coupled to an output of the input amplifier and a second input coupled to receive a local oscillator signal; and an offset reduction circuit coupled at an output of the mixer, wherein the offset reduction circuit includes a transconductance amplifier having a programmable gain adjusted in response to gain variations in the input amplifier or the mixer.

In yet another embodiment, the present invention provides a method for reducing dc offset from a signal path in a receiver, comprising sampling the dc offset on the signal path at an output of a mixer, storing the offset signal on capacitive elements, feeding back the stored offset signal via a transconductance amplifier; adjusting a gain of the transconductance amplifier in response to variations in signal gain along the signal path; and subtracting the dc offset from the signal along the signal path.

A better understanding of the nature and advantages of the dc offset reduction technique of the present invention will be gained with reference to the detailed description below and the accompanying drawings.

DESCRIPTION OF THE SPECIFIC EMBODIMENTS

Figure 1:
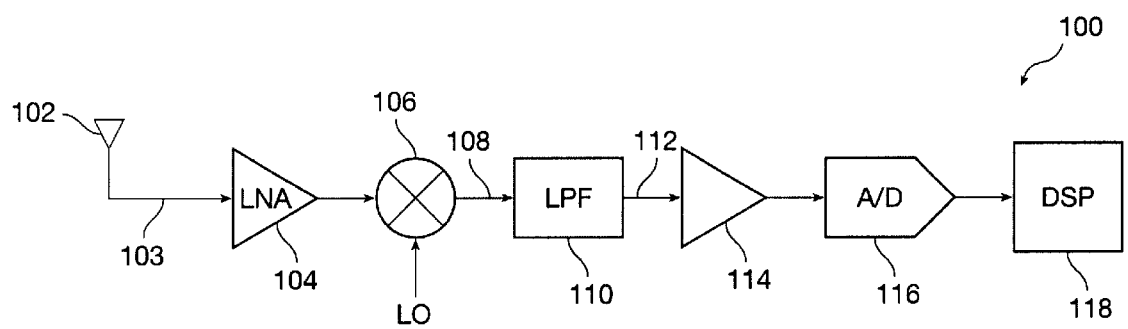
FIG. 1 is a simplified block diagram of a direct conversion receiver circuit.
Figure 2A:
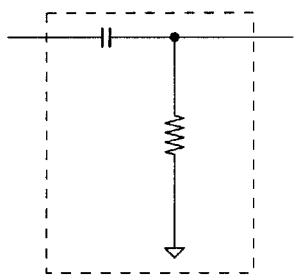
FIGS. 2A and 2B show RC and switched-capacitor circuits, respectively, typically employed as ac coupling circuits to remove dc offset.
Figure 2B:
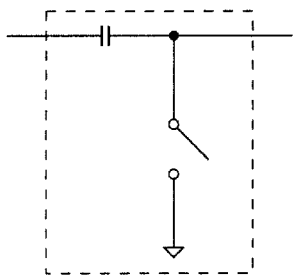
Figure 3:
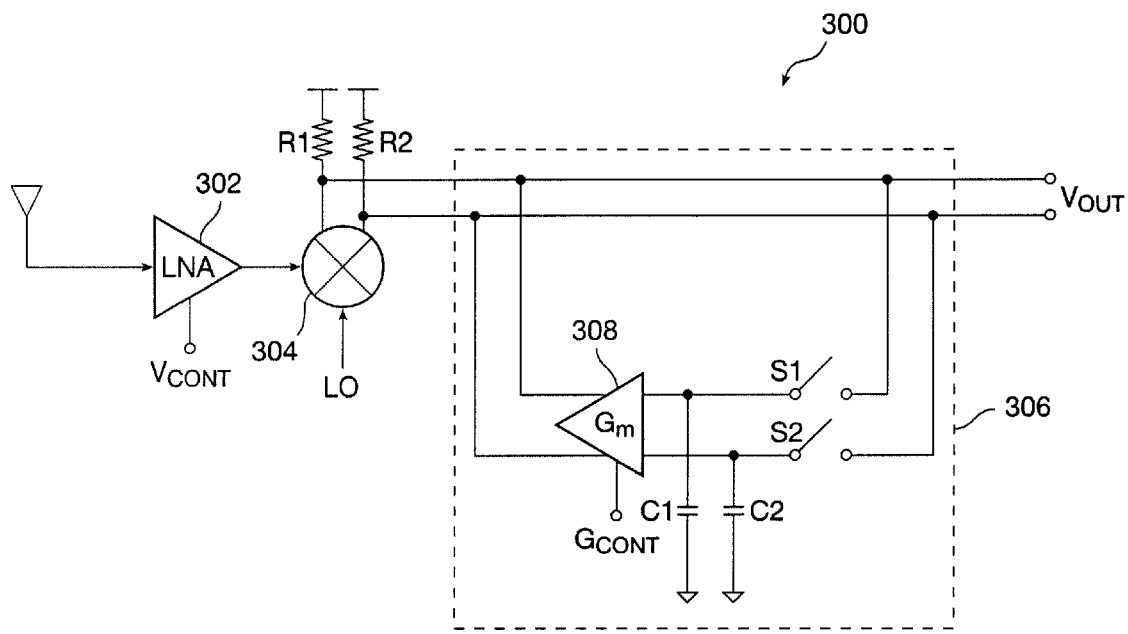
FIG. 3 shows an exemplary embodiment of the dc offset reduction technique of the invention as used in the context of a direct conversion receiver.

Referring to FIG. 3, there is shown an exemplary embodiment of a dc offset reduction technique according to the invention as used in the context of a direct conversion receiver 300. FIG. 3 is a partial schematic of the receiver showing an input low-noise amplifier LNA 302 that receives the input signal from an antenna. LNA 302 amplifies the input signal and applies it to a mixer 304. Either one or both of LNA 302 and mixer 304 may have programmable gain control. In this example, LNA 302 is provided with a voltage control input Vcont that programmably sets the amplifier either in a high gain mode or a low gain mode depending on the logic state of the signal applied at Vcont. The IF signal Vout at the output of mixer 304 is differential in nature and is processed by further circuitry (not shown). In this embodiment, the present invention deploys an offset reduction circuit 306 at the output of mixer 304. Offset reduction circuit 306 includes a pair of switches S1 and S2 that respectively connect the differential mixer output signal to capacitors C1 and C2. Vout is thus sampled and stored onto capacitors C1 and C2 when switches S1 and S2 are closed. The sampled and stored signal (Vos) is fed back to the Vout line and subtracted from Vout via a transconductance amplifier Gm 308. According to the invention Gm 308 is designed such that its gain can be programmed by a gain control signal Gcont. This allows offset reduction circuit 306 to track gain variations in LNA 302 or mixer 304. It is to be understood that the dc offset reduction technique is described herein in the context of a receiver for illustrative purposes only, and that the technique can be employed in other types of circuitry with a data path that is sensitive to variations in dc offset.

Figure 4:
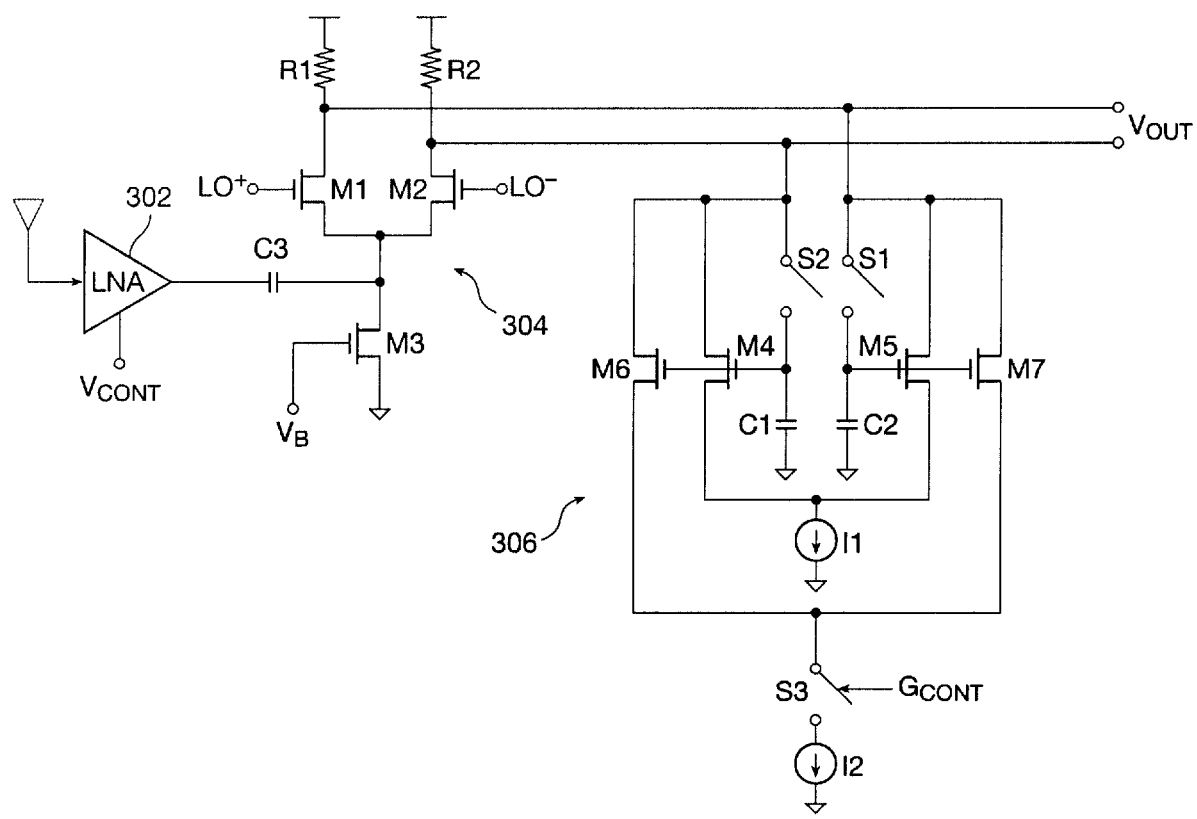
FIG. 4 shows a simplified circuit implementation of the dc offset reduction technique as used in FIG. 3.

FIG. 4 shows an exemplary circuit implementation for the dc offset reduction technique of FIG. 3. In this embodiment, mixer 304 includes a differential pair of transistors M1 and M2 that receive a differential LO signal at their gate terminals respectively. Transistor M3 has its gate driven by a bias signal Vb and provides a current source for the differential pair, and resistors R1 and R2 (R1=R2=R) act as the load devices for transistors M1 and M2, respectively. Implementations for mixer circuitry are described in greater detail in commonly-assigned patent application Ser. Nos. 09/690, 937, titled "Variable Gain Mixer Circuit," and 09/690,698, titled "Multi-phase Mixer," both of which are hereby incorporated by reference. The RF signal at the output of LNA 302 is applied to the common source node of the differential pair via capacitor C3. Variable gain dc offset reduction circuit 306 includes switches S1 and S2 that connect the differential output signal Vout to capacitors C1 and C2, respectively. A first pair of transistors M4 and M5 have their gate terminals connected to the top plates of capacitors C2 and C1, respectively. The source/drain terminals of transistors M4 and M5 connect between the differential output terminals Vout and a current source device I1. A second pair of transistors M6 and M7 have their source/drain terminals connected between the differential output terminals Vout and a second current source device I2 via a programmable switch S3. Switch S3 is controlled by control signal Gcont.

In this embodiment, transistors M4 and M5 provide the feedback transconductance elements having an equal transconductance value of gm1. Transistors M6 and M7 provide additional transconductance gm2 such that, when activated by switch S3, the overall gain of the effective loop transconductance element is increased. To adjust for sudden gain changes in the signal path introduced by, for example, LNA 302, signal Gcont may be logically tied to the gain control signal Vcont. Thus, if the gain ratio for LNA 302 is [(high gain)/(low gain)]=P, then the Trasconductance ratio can be set to [(gm2+gm1)/gm1]=P. When Vcont causes LNA 302 to switch from a low gain to a high gain state, Gcont is closed to compensate for the change in gain, keeping the dc offset at or near zero. Accordingly:

Given, $V_{i\_dco}-[V'\times gm1\times R]\approx 0$, then $[V_{i\_dco}\times\infty]-[V'\times R\times(gm1+gm2)]\approx 0$ Where, $V_{i\_dco}$ is the input dc offset voltage, V' is the voltage stored on capacitors C1 an C2, R is the resistance of load resistors R1 and R2, and ∞ is the change in gain.

It is to be understood that the circuit implementation shown in FIG. 4 is provided as an example for illustrative purposes only. Various modifications are possible. For example, multiple programmable transconductance elements can be added to provide higher resolution in gain programmability. In an alternative embodiment, transistors M4 and M5 may also connect to current source I1 via a programmable switch. Also, the embodiment shown does not address any offset that may be introduced by the transconductance stage itself. In an alternative embodiment switching circuitry may be added to implement a self-zeroing of any dc offset in the transconductance circuit.

Figure 5:
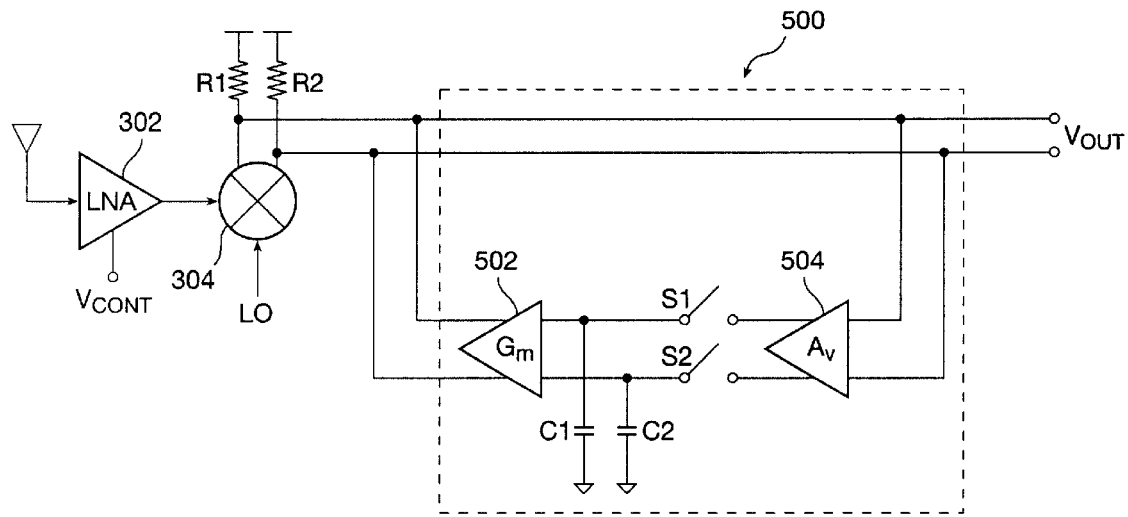
FIG. 5 shows another embodiment of the dc offset reduction circuit according to the present invention.

In yet another embodiment, the present invention provides an offset reduction circuit that optimizes noise contribution versus loop gain of the offset reduction circuit. Referring to FIG. 5, there is shown an alternative embodiment wherein a dc offset reduction circuit 500 includes an additional amplifier 504 in the loop. In this embodiment, amplifier 504 is inserted in the feedback path before the transconductance element. This provides for more design freedom by allowing the gain, and thus the noise contribution, of transconductance element Gm 502 to be reduced, while the overall loop gain is maintained by amplifier 504. Since amplifier 504 does not contribute to the output noise, it can be made fairly large. Without the burden of providing the loop gain, Gm 502 in turn can be made relatively smaller to minimize its noise contribution to Vout.

Figure 6:
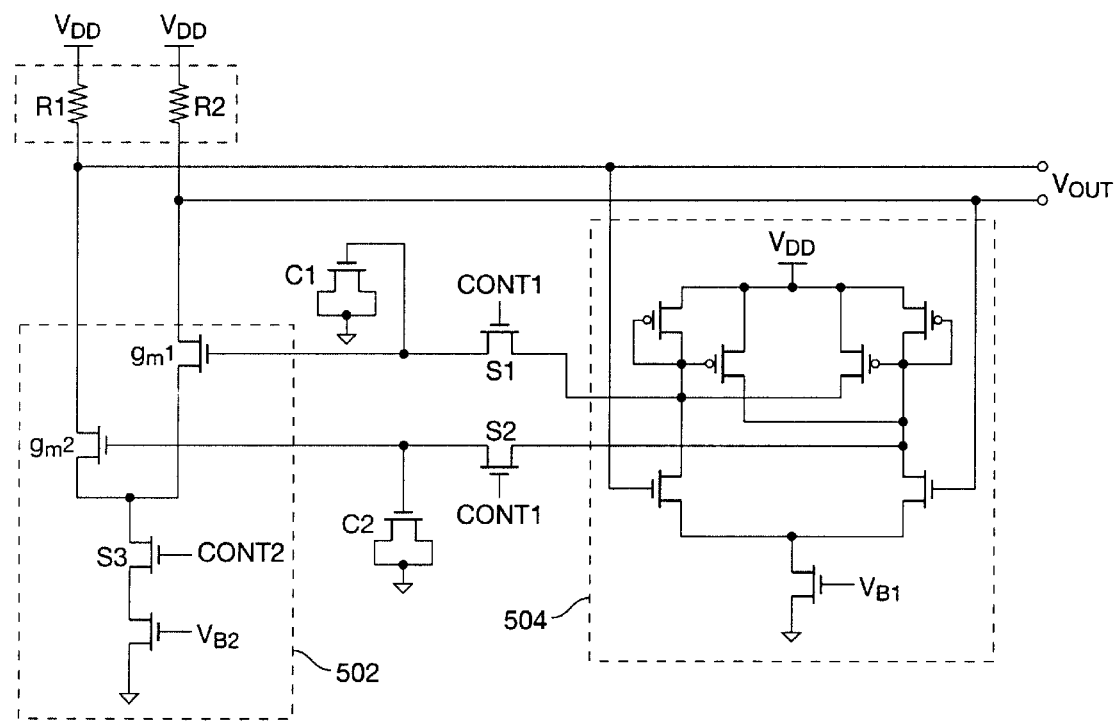
FIG. 6 is an exemplary circuit implementation for the embodiment shown in FIG. 5.

FIG. 6 shows a partial circuit schematic for an exemplary transistor-level implementation of the embodiment shown in FIG. 5. Amplifier 504 is implemented by a differential pair amplifier with n-channel input transistors and split-gate p-channel load transistors. The split-gate load transistors provide for increased gain. Other types of well-known operational amplifiers can also be used. Switches S1 and S2 and capacitors C1 and C2 are implemented by n-channel transistors as shown. In alternative embodiments, complementary MOS transistors (i.e., parallel-connected p-channel and n-channel transistors) can be used for the switches, and other capacitor structures such as polysilicon-dielectric-polysilicon or metal-insulator-metal can also be used for C1 and C2. In this embodiment, transconductance element 502 is made up of transistors gm1 and gm2 that are connected to a current source transistor via a programmable switch S3 as shown. Multiple transconductance elements 502 are connected to Vout to provide for higher resolution in gain control. The number is determined by the minimum gain change that needs to be resolved as required by the circuit configuration. For example, in one embodiment, 32 identical transconductance elements 502 are connected to Vout, each enabled programmably by its respective switch S3. Such an embodiment would have 32 control lines Cont2 to individually enable each unit 502. In this embodiment, at least one programmable transconductance element 502 is enabled at any given time.

Figure 7:
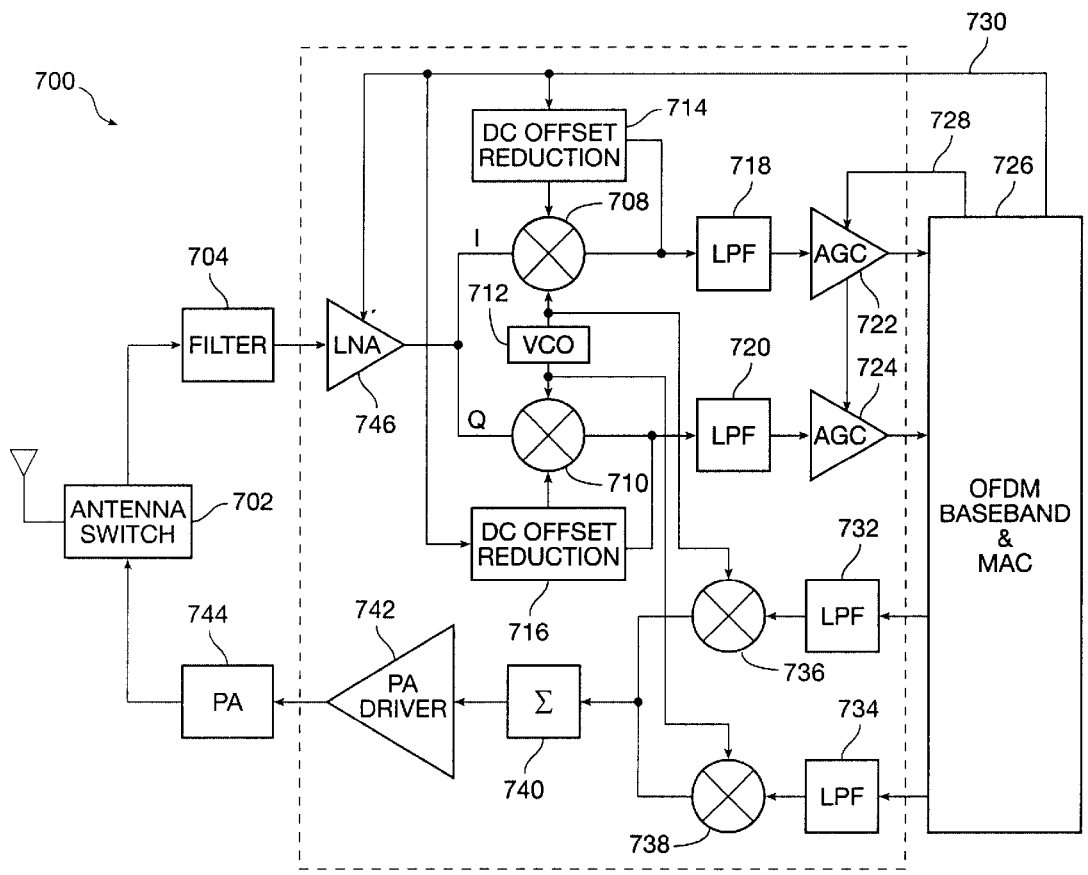
FIG. 7 is a block diagram of an RF tranceiver with reduced dc offset in accordance with an embodiment of the present invention.

The dc offset reduction techniques of the present invention are particularly well suited for highly noise sensitive high speed communication circuits. FIG. 7 is a block diagram of an RF tranceiver 700 with reduced dc offset in accordance with an embodiment of the present invention. An antenna switch 702 operates to switchably connect the antenna to the receiver or the transmitter circuitry of tranceiver 700. The receive channel includes a filter 704 that receives the signal from the antenna and operates to reject unwanted signals such as noise from adjacent channels. A low noise amplifier 706 amplifies the signal at the output of filter 704. and supplies it to in-phase (I) and quadrature-phase (Q) down-conversion mixers 708 and 710, respectively. A voltage controlled oscillator (VCO) 712 generates a pair of local oscillating signals that are 90 degrees out-of-phase with respect to each other. The local oscillating signals are respectively supplied to the I and Q mixers. Dc offset reduction circuits 714 and 716 of the type described above are coupled around mixers 708 and 710, respectively. The I and Q signals are respectively filtered by low pass filters (LPFs) 718 and 720, and the filtered lower frequency signals are applied to automatic gain control (AGC) circuits 722 and 724, respectively. One example f a preferred implementation for LPFs 718 and 720 is described in greater detail in commonly-assigned patent application Ser. No. 09/612,116, titled "Active Circuit having LC Trap Functionality," which is hereby incorporated by reference. The baseband signal processing is performed by block 726 that receives outputs of AGCs 722 and 724 and converts the analog signals to digital signal before processing them using, for example, orthogonal frequency division multiplexing (OFDM). In this embodiment, block 726 also provides media access control (MAC) functionality. The gain adjustment control signals 728 and 730 are provided by block 726. Control signal 728 adjusts the gain of AGCs 722 and 724. Control signal 730 adjusts the gain of LNA 706, dc offset reduction circuits 714 and 716, and, in some embodiments, mixers 708 and 710. The receive channel includes low pass filters (LPFs) 732 and 734 that receive the I and Q signals and supply them to I and Q up-conversion mixers 736 and 738. In this embodiment, both transmit and receive signals are differential in nature. The outputs of the two up-conversion mixers are combined and applied to a differential to single-ended converter 740. One preferred embodiment of a differential to single-ended converter is described in greater detail in commonly-assigned patent application Ser. No. 09/784,735 titled "Differential to Single-ended Converter with Large Output," which is hereby incorporated by reference. The single-ended output of converter 740 is supplied to a power amplifier driver 742 which drives the input of a power amplifier 744 before being supplied to switch 702. In a specific embodiment, this block diagram implements a 5 GHz RF tranceiver according to the IEEE 802.11 a standard.

Figure 8:
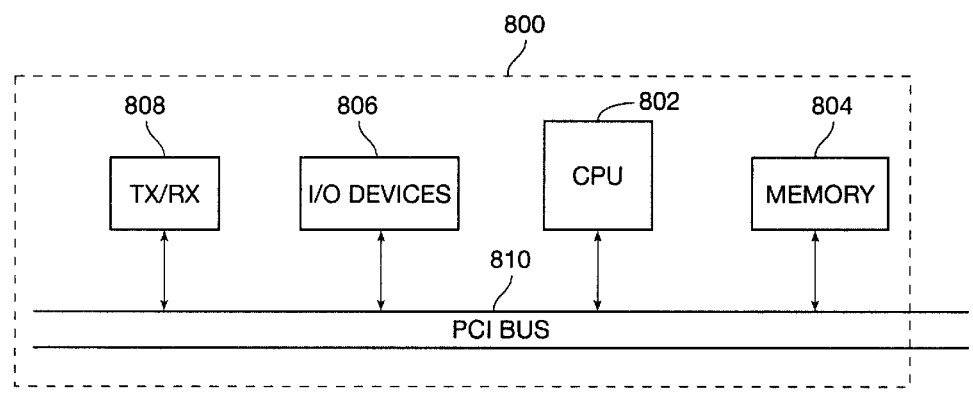
FIG. 8 is a block diagram for one example of an electronic system having optimized performance in accordance with one embodiment of the present invention.

According to another embodiment of the present invention, the dc offset reduction technique as embodied in the tranceiver of FIG. 7 allows for implementation of various electronic systems that are capable of wireless RF communication with optimized performance. Such electronic systems include desktop and laptop personal computers, mobile telephone, television and internet devices, home gateways and media servers, portable digital music devices, data pipes and the like. FIG. 8 shows a simplified block diagram for one example of an electronic system having optimized performance according to the present invention. In this example, a desktop personal computer 800 is used for illustrative purposes. System 800 includes a central processing unit (CPU) 802, memory 804, input/output (I/O) devices 806 and tranceiver 808 all coupled to a common personal computer interface (PCI) bus 810. Tranceiver 808 may be incorporated into and couple to PCI bus 810 via I/O devices block 806. Tranceiver 808 is of the type described above in connection with FIG. 7. Via PCI bus 810 tranceiver 808 allows system 800 to wirelessly communicate with other RF wireless devices.

In conclusion, the present invention provides method and circuitry for dc offset reduction that is effective under varying circuit and signal conditions. The offset signal is sampled and stored by a switched-capacitor circuit and subtracted from the signal via a programmable transconductance element that is placed in a feedback loop. Thus, no capacitors are placed along the signal path and the programmability of the gain in the transconductance element allows the dc offset reduction circuit to effectively address changes in the signal amplification along the signal path. While the above provides detailed description of various embodiments, it is to be understood that various alternatives, equivalents and modifications are possible. For example, in the embodiments described, the programmable transconductance elements compensate for gain variations in an input amplifier in a receiver. The invention is clearly not limited to such applications, and the programmable transconductance element may compensate for gain variations in any circuit block along any signal path that may introduce sudden or gradual changes in signal gain affecting the offset. Also, while the specific implementation shown in FIG. 4 includes one switch (S3) to program the gain of the transconductance element, higher degree of programmability may be achieved by adding more transistors and switches that can be programmably enabled. For example, the addition of one more switched transconductance element would allow for four different gain levels. Therefore, the scope of the invention should not be limited to the embodiments described, and should instead be determined by the following claims and their full breadth of equivalents.

What is claimed is:

1. A circuit comprising:
   a signal path having an input terminal coupled to receive an input signal;
   a variable gain circuit coupled to receive the input signal and to generate an output signal at an output terminal; and
   an offset reduction circuit coupled to the output terminal, wherein, the offset reduction circuit comprises:
   a variable gain transconductance amplifier;
   a first capacitor coupled to the variable gain transconductance amplifier; and a first switch coupled between the first capacitor and the output terminal, wherein, a gain of the variable gain transconductance amplifier is adjusted in response to variations in a gain of the variable gain circuit.

2. The circuit of claim 1 wherein the variable gain transconductance amplifier comprises:

a first field effect transistor having a gate terminal coupled to the first capacitor, a first source/drain terminal coupled to the output terminal, and a second source/drain terminal coupled to a first current source device; and a second field effect transistor having a gate terminal coupled to the first capacitor, a first source/drain terminal coupled to the output terminal, and a second source/drain terminal coupled to a second current source device via a programmable switch.

3. The circuit of claim 2 wherein the signal path is differential with the output terminal having a differential pair of wires, and wherein the first switch and the first and second transistors couple to a first one of the differential pair of wires.

4. The circuit of claim 3 wherein the offset reduction circuit further comprises:

a second capacitor coupled to the variable gain transconductance amplifier; and a second switch coupled between the second capacitor and the second one of the differential pair of wires.

5. The circuit of claim 4 wherein the variable gain transconductance amplifier further comprises:

a third field effect transistor having a gate terminal coupled to the second capacitor, a first source/drain terminal coupled to a second one of the differential pair of wires, and a second source/drain terminal coupled to the first current source device; and a fourth field effect transistor having a gate terminal coupled to the second capacitor, a first source/drain terminal coupled to the second one of the differential pair of wires, and a second source/drain terminal coupled to the second current source device via the programmable switch.

6. The circuit of claim 5 further comprising a pair of resistive loads respectively coupled to the differential pair of wires.

7. The circuit of claim 6 wherein the variable gain circuit comprises an input amplifier whose gain is programmably adjusted.

8. The circuit of claim 7 wherein the signal path further comprises a mixer having a first input coupled to an output of the input amplifier, a second input coupled to receive an oscillating signal, and a differential output coupled to the differential pair of wires.

9. The circuit of claim 1 wherein the offset reduction circuit further comprises a signal amplifier coupled between the output terminal and the variable gain transconductance amplifier.

10. The circuit of claim 9 wherein a gain of the signal amplifier is programmable.

11. A receiver circuit comprising:

an input amplifier coupled to receive an input radio frequency (RF) signal;

a mixer having one input coupled to an output of the input amplifier and a second input coupled to receive an oscillating signal, the mixer having a differential output with a pair of resistive load devices coupled to the differential output; and an offset reduction circuit including:

a programmable transconductance amplifier having a differential output coupled to the differential output of the mixer, a pair of switches respectively coupled between the differential output of the mixer and differential input of the programmable transconductance amplifier, and a pair of capacitive elements respectively coupled to the pair of switches and the differential input of the programmable transconductance amplifier, wherein, the programmable transconductance amplifier is configured such that its gain is programmably adjusted in response to changes in the gain of one of the input amplifier or the mixer.

12. The receiver circuit of claim 11 further comprising a voltage amplifier coupled between the differential output of the mixer and the pair of switches.

13. The receiver circuit of claim 11 further comprising:

a low pass filter coupled to the output of the mixer; and an automatic gain control block coupled to an output of the low pass filter.

14. A transceiver comprising the receiver circuit of claim 11 coupled to a transmitter circuit.

15. An electronic system comprising the transceiver of claim 14 coupled to an interface bus, the electronic system being capable of wireless data communication with another electronic system via the transceiver.

16. The electronic system of claim 15 wherein the electronic system is a personal computer.

17. The electronic system of claim 16 wherein the personal computer further comprises a central processing unit (CPU), memory and I/O devices coupled to the interface bus.

18. A method for reducing dc offset from a signal path in a receiver, comprising:

sampling the dc offset on the signal path at an output of a mixer;

storing the dc offset signal on a capacitive element;

feeding back the stored dc offset signal via a transconductance amplifier;

adjusting a gain of the transconductance amplifier in response to variations in signal gain along the signal path; and subtracting the dc offset from the signal along the signal path.

19. The method of claim 18 further comprising amplifying a magnitude of a signal on the signal path before sampling and storing the dc offset.

20. The circuit of claim 11, wherein the differential output of the mixer comprises a first wire and second wire, and wherein the programmable transconductance amplifier comprises a first leg including:

a first field effect transistor having a gate terminal coupled to a first one of the pair of capacitive elements, a first source/drain terminal coupled to the first wire, and a second source/drain terminal coupled to a first current source device; and a second field effect transistor having a gate terminal coupled to the first capacitor, a first source/drain terminal coupled to the first wire, and a second source/drain terminal coupled to a second current source device via a programmable switch.

21. The circuit of claim 20, wherein the programmable transconductance amplifier further comprises a second leg including:

a third field effect transistor having a gate terminal coupled to a second one of the pair of capacitive elements, a first source/drain terminal coupled to the second wire, and a second source/drain terminal coupled to the first current source device; and a fourth field effect transistor having a gate terminal coupled to the second capacitor, a first source/drain terminal coupled to the second wire, and a second source/drain terminal coupled to the second current source device via the programmable switch.

22. The circuit of claim 12, wherein the voltage amplifier is a differential amplifier comprising first and second differential input n-channel transistors respectively coupled to first and second split-gate p-channel load transistors.

23. The receiver circuit of claim 11 wherein the programmable transconductance amplifier comprises a plurality of programmable transconductance elements, each programmable transconductance element comprising:

a pair of transistors having their gate terminals respectively coupled to the pair of switches, their first source/drain terminals respectively coupled to power supply via a respective load devices, and their second source/drain terminals coupled to a common node;

a switch transistor coupled between the common node and a bias node, with a gate terminal coupled to receive switch control signal; and a bias transistor coupled between the bias node and ground. with a gate terminal coupled to receive a bias voltage.

24. The receiver circuit of claim 23 wherein the pair of switches and the pair of transistors comprise n-channel transistors.

25. The receiver of claim 24 wherein the capacitive elements comprise n-channel transistors configured to function as capacitors.

* * * * *